(12) United States Patent
Lai et al.

(10) Patent No.: US 9,691,704 B1
(45) Date of Patent: Jun. 27, 2017

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Kuo-Chih Lai, Tainan (TW);
Chia-Chang Hsu, Kaohsiung (TW);
Nien-Ting Ho, Tainan (TW);
Ching-Yun Chang, Tainan (TW);
Yen-Chen Chen, Tainan (TW);
Shih-Min Chou, Tainan (TW);
Yun-Tzu Chang, Kaohsiung (TW);
Yang-Ju Lu, Changhua (TW);
Wei-Ming Hsiao, Miaoli County (TW);
Wei-Ning Chen, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/175,299

(22) Filed: Jun. 7, 2016

(30) Foreign Application Priority Data

Apr. 25, 2016 (CN) .......................... 2016 1 0260924

(51) Int. Cl.
| | | |
|---|---|---|
| H01L 23/48 | (2006.01) | |
| H01L 23/52 | (2006.01) | |
| H01L 29/40 | (2006.01) | |
| H01L 21/76 | (2006.01) | |
| H01L 23/528 | (2006.01) | |
| H01L 23/522 | (2006.01) | |
| H01L 23/532 | (2006.01) | |
| H01L 21/768 | (2006.01) | |
| H01L 21/3213 | (2006.01) | |

(52) U.S. Cl.
CPC ...... *H01L 23/528* (2013.01); *H01L 21/32133* (2013.01); *H01L 21/7682* (2013.01); *H01L 21/7685* (2013.01); *H01L 21/76816* (2013.01); *H01L 21/76877* (2013.01); *H01L 23/5226* (2013.01); *H01L 23/5329* (2013.01)

(58) Field of Classification Search
CPC ............... H01L 23/528; H01L 23/5226; H01L 23/5329; H01L 21/76816
USPC .......................................... 438/421; 257/774
See application file for complete search history.

(56) References Cited

U.S. PATENT DOCUMENTS

| | | |
|---|---|---|
| 5,869,880 A | 2/1999 | Grill et al. |
| 7,534,696 B2 | 5/2009 | Jahnes et al. |
| 2002/0145201 A1* | 10/2002 | Armbrust ............ H01L 21/7682 257/776 |

\* cited by examiner

*Primary Examiner* — David S Blum
(74) *Attorney, Agent, or Firm* — WPAT, PC

(57) ABSTRACT

A semiconductor structure comprises a first wire level, a second wire level and a via level. The first wire level comprises a first conductive feature. The second wire level is disposed on the first wire level. The second wire level comprises a second conductive feature and a third conductive feature. The via level is disposed between the first wire level and the second wire level. The via level comprises a via connecting the first conductive feature and the second conductive feature. There is a first air gap between the first conductive feature and the second conductive feature. There is a second air gap between the second conductive feature and the third conductive feature. The first air gap and the second air gap are linked.

15 Claims, 11 Drawing Sheets

US 9,691,704 B1

SEMICONDUCTOR STRUCTURE AND METHOD FOR MANUFACTURING THE SAME

This application claims the benefit of People's Republic of China application Serial No. 201610260924.4, filed on Apr. 25, 2016, the subject matter of which is incorporated herein by reference.

BACKGROUND

Technical Field

The disclosure relates to a semiconductor structure and a method for manufacturing the same. More particularly, the disclosure relates to a semiconductor structure comprising air gaps and a method for manufacturing the same.

Description of the Related Art

In a semiconductor structure, overlying conductive features, such as traces, are typically used for signal transfer. The traces are disposed in a plurality of wire levels. Further, the traces disposed in two wire levels are typically connected by vias disposed in a via level, but separated by a dielectric material in the via level. These traces and vias affect the signal propagation delays related to RC time constants. The problem becomes more critical as the semiconductor structures become smaller. Accordingly, reducing the capacitance formed between conductive features (for example, traces) of two overlapping wire levels, the capacitance formed between conductive features of the same wire level, or the like may be beneficial for the operation of a semiconductor device.

SUMMARY

This disclosure is directed to an approach to reduce the capacitances as described above.

According to some embodiments, a semiconductor structure is provided. The semiconductor structure comprises a first wire level, a second wire level and a via level. The first wire level comprises a first conductive feature. The second wire level is disposed on the first wire level. The second wire level comprises a second conductive feature and a third conductive feature. The via level is disposed between the first wire level and the second wire level. The via level comprises a via connecting the first conductive feature and the second conductive feature. There is a first air gap between the first conductive feature and the second conductive feature. There is a second air gap between the second conductive feature and the third conductive feature. The first air gap and the second air gap are linked.

According to some embodiments, a method for manufacturing a semiconductor structure is provided. The method comprises the following steps. First, a preliminary structure is provided. The preliminary structure comprises a first wire level. The first wire level comprises a first conductive feature. Then, a first sacrificial place-holding feature is formed in a via level above the first wire level. A second sacrificial place-holding feature is formed in a second wire level above the via level. Thereafter, a via of the via level is formed, and a second conductive feature and a third conductive feature of the second wire level are formed, wherein the via connects the first conductive feature and the second conductive feature. Then, the first sacrificial place-holding feature and the second sacrificial place-holding feature are removed to form a first air gap and a second air gap, wherein the first air gap is between the first conductive feature and the second conductive feature, the second air gap is between the second conductive feature and the third conductive feature, and the first air gap and the second air gap are linked.

BRIEF DESCRIPTION OF THE DRAWINGS

FIGS. 2 to 14A-14B illustrate a semiconductor structure at various stages of manufacturing according to embodiments.

Figure 1A:
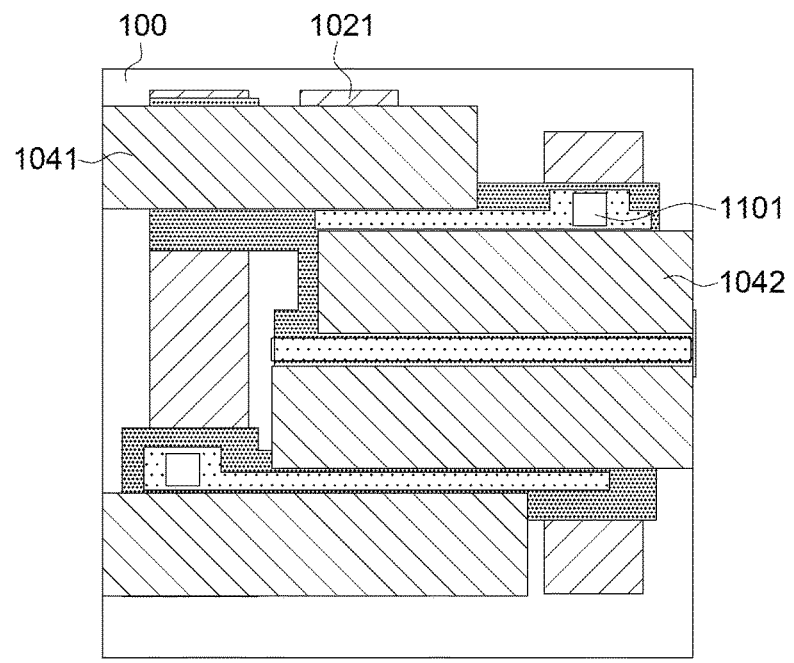
FIGS. 1A-1D illustrates a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. It is to be noted that, unless explicitly described to the contrary, a singular form includes a plural form in the present disclosure and the claims. Further, it is contemplated that elements and features of one embodiment may be beneficially incorporated in another embodiment without further recitation.

Figure 1B:
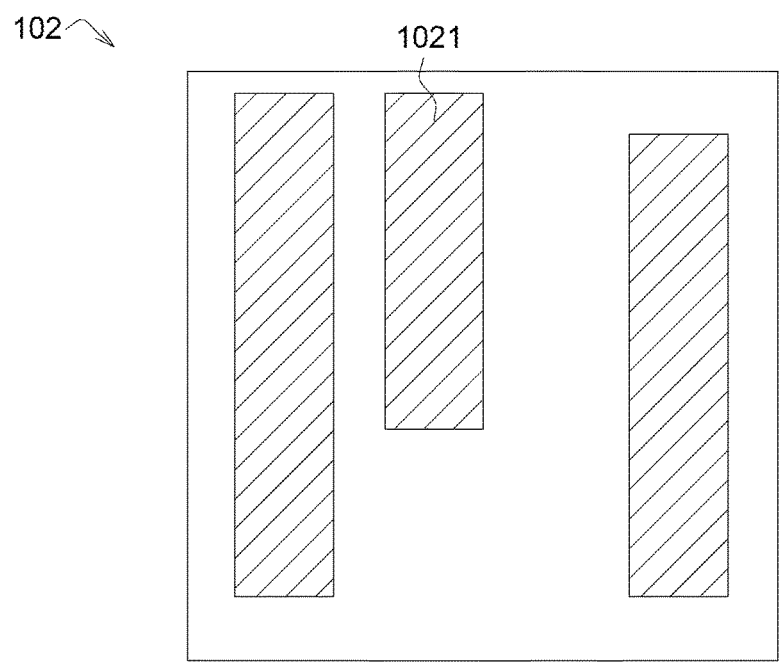
Figure 1C:
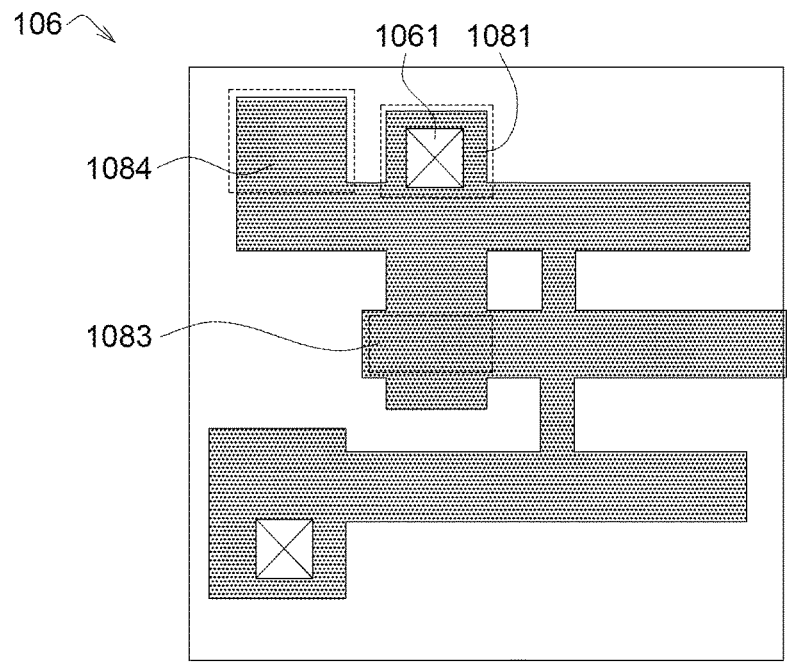
Figure 1D:
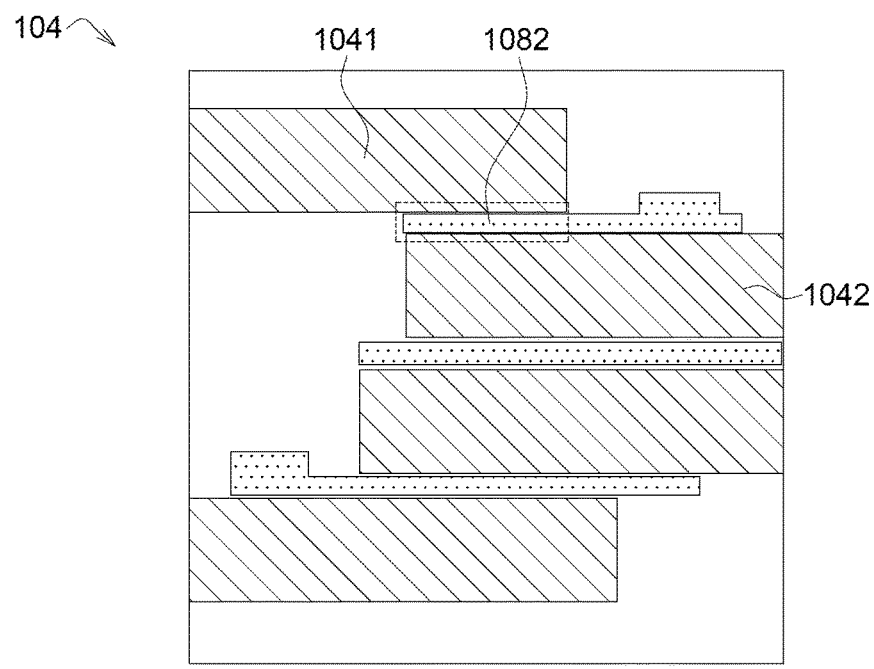

Referring to FIGS. 1A-1D, a semiconductor structure according to embodiments is illustrated from a top view perspective. The semiconductor structure comprises a first wire level 102, which is illustrated in FIG. 1B, a second wire level 104, which is illustrated in FIG. 1D, and a via level 106, which is illustrated in FIG. 1C. The first wire level 102 comprises a first conductive feature 1021. The second wire level 104 is disposed on the first wire level 102. The second wire level 104 comprises a second conductive feature 1041 and a third conductive feature 1042. The via level 106 is disposed between the first wire level 102 and the second wire level 104. The via level 106 comprises a via 1061 connecting the first conductive feature 1021 and the second conductive feature 1041.

Figure 10:
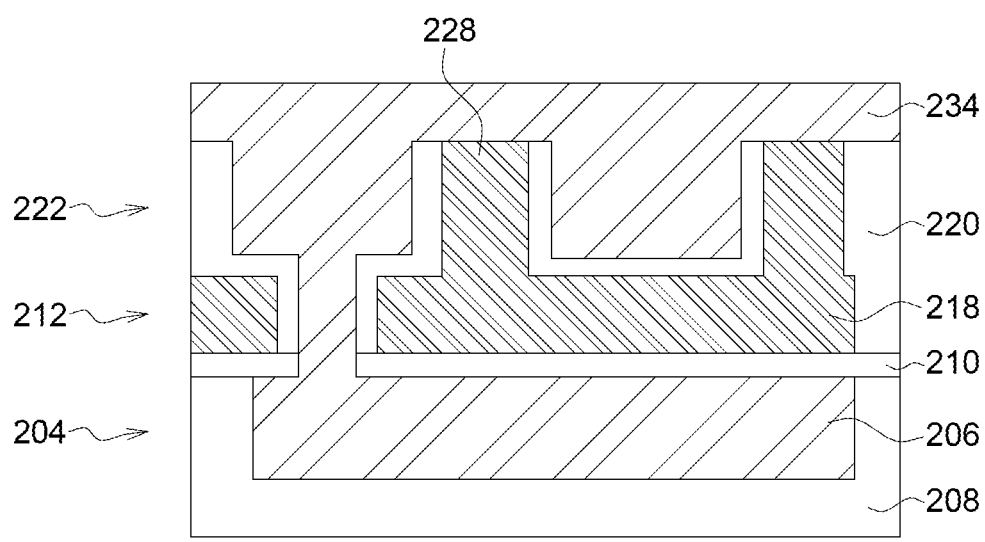

The semiconductor structure comprises inter-layer air gap(s) and intra-layer air gap(s). According to the embodiments, there is a first air gap 1081 between the first conductive feature 1021 and the second conductive feature 1041, and there is a second air gap 1082 between the second conductive feature 1041 and the third conductive feature 1042. The first air gap 1081 and the second air gap 1082 are linked (i.e., directly or indirectly spatially connected). In some embodiments, there is a third air gap 1083 between the first conductive feature 1021 and the third conductive feature 1042. The third air gap 1083 and the first and second air gaps 1081 and 1082 are linked. In some embodiments, as shown in FIG. 10, the first air gap 1081 surrounds the via 1061. However, an inter-layer air gap between the conductive features of two overlapping wire levels does not necessarily surround a via connecting the conductive features, such as the fourth air gap 1084 shown in FIG. 10.

The first wire level 102, the second wire level 104 and the via level 106 may be disposed on a substrate 100 with semiconductor devices, such as a CMOS, flash, and/or the like formed thereon. According to some embodiments, the semiconductor structure further comprises a first barrier layer (not shown in FIGS. 1A-1D) disposed on the first wire level 102 and a second barrier layer (not shown in FIGS.

1A-1D) disposed on the second wire level 104. The via 1061 is through the first barrier layer. The second barrier layer may have a through hole 1101 through which a sacrificial place-holding material is removed and thereby the air gaps are formed. According to some embodiments, the first wire level 102 further comprises a dielectric (not shown in FIGS. 1A-1D) surrounding the first conductive feature 1021, the second wire level 104 further comprises a dielectric (not shown in FIGS. 1A-1D) surrounding the second conductive feature 1041 and the third conductive feature 1042, and the via level 106 further comprises a dielectric (not shown in FIGS. 1A-1D) surrounding the via 1061.

Referring to FIGS. 2 to 14A-14B, a method for manufacturing a semiconductor structure according to embodiments is illustrated. First, a preliminary structure is provided. The preliminary structure comprises a first wire level. The first wire level comprises a first conductive feature. Then, a first sacrificial place-holding feature is formed in a via level above the first wire level. A second sacrificial place-holding feature is formed in a second wire level above the via level. Thereafter, a via of the via level is formed, and a second conductive feature and a third conductive feature of the second wire level are formed, wherein the via connects the first conductive feature and the second conductive feature. Then, the first sacrificial place-holding feature and the second sacrificial place-holding feature are removed to form a first air gap and a second air gap, wherein the first air gap is between the first conductive feature and the second conductive feature, the second air gap is between the second conductive feature and the third conductive feature, and the first air gap and the second air gap are linked.

Figure 2:
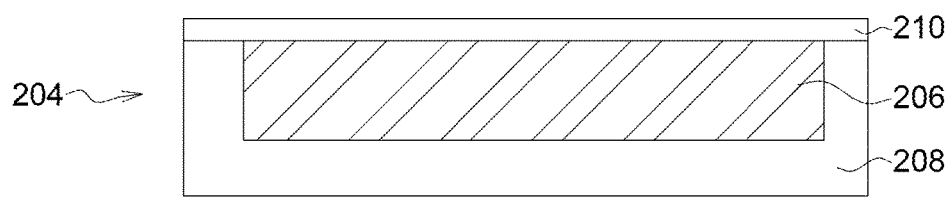

A preliminary structure 202 is illustrated in FIG. 2. The preliminary structure 202 comprises a first wire level 204. The first wire level 204 comprises a first conductive feature 206 (such as a trace). The first conductive feature 206 may be formed of Cu. The preliminary structure 202 may further comprise a dielectric 208 surrounding the first conductive feature 206. The dielectric 208 may be formed of $SiO_2$. The preliminary structure 202 may further comprise a first barrier layer 210 disposed on the first wire level 204. The first barrier layer 210 may be formed of a material that will not be etched by a typical etchant, such as SiCO, SiCN, SiN, or the like.

Figure 3:
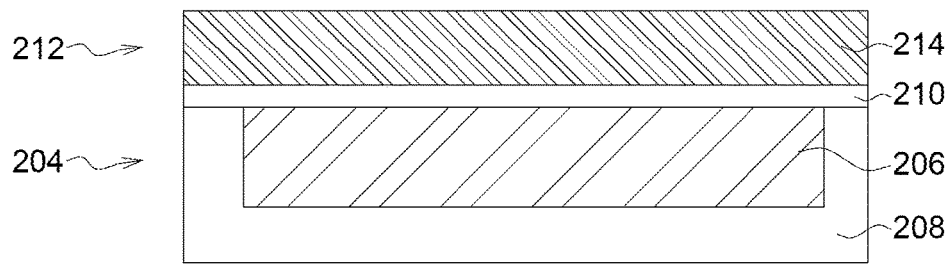
Figure 4A:
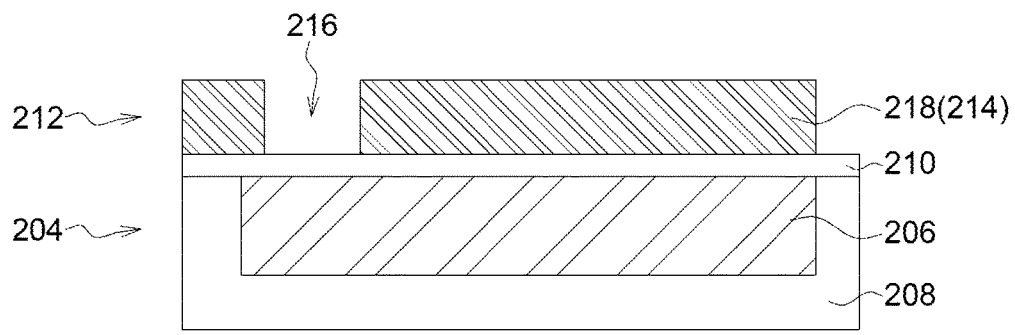
Figure 4B:
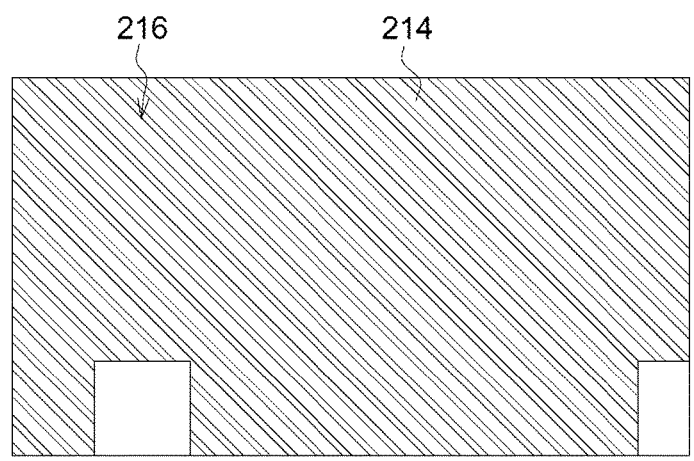

In the following step, a layer 214 of a sacrificial place-holding material is formed on the preliminary structure 202, particularly formed in a via level 212 above the first wire level 204, as shown in FIG. 3. The sacrificial place-holding material may be a material that can be etched by a typical etchant. In particular, the sacrificial place-holding material may comprise a metal element. For example, the sacrificial place-holding material may comprise at least one selected from the group consisting of: TiN, Ti, Ni, Co, TaN, Ta, Al, TiAl, and TaAl. The sacrificial place-holding material may be an anti-reflective material, such as TiN. It will be beneficial for the alignment in following processes. Then, a first opening 216 configured for a via 236 (shown in FIGS. 11A-11B) of the via level 212 is formed in the layer 214 of the sacrificial place-holding material, as shown in FIGS. 4A-4B, wherein FIG. 4A shows a cross-sectional view as FIGS. 2 and 3, and FIG. 4B shows a top view. As such, a first sacrificial place-holding feature 218, which comprises the layer 214 of the sacrificial place-holding material having the first opening 216 configured for the via 236, is formed in the via level 212 above the first wire level 204. The first sacrificial place-holding feature 218 defines the positions of one or more inter-layer air gaps.

Figure 5:
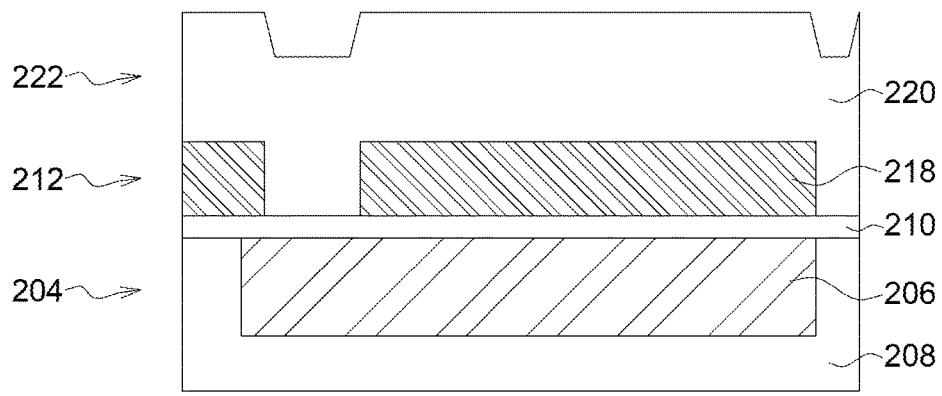
Figure 6A:
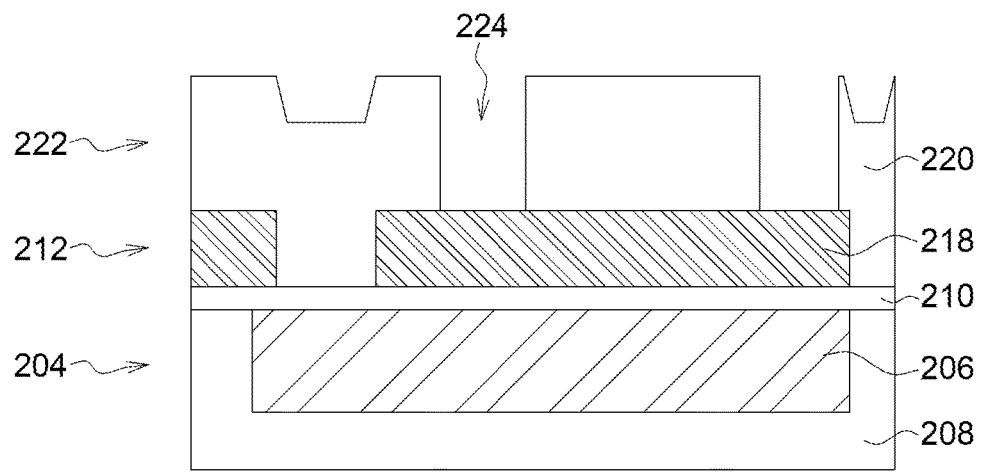
Figure 6B:
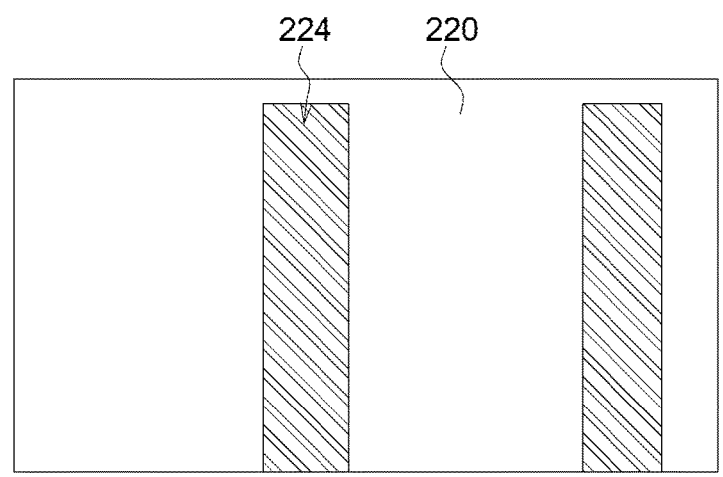
Figure 7:
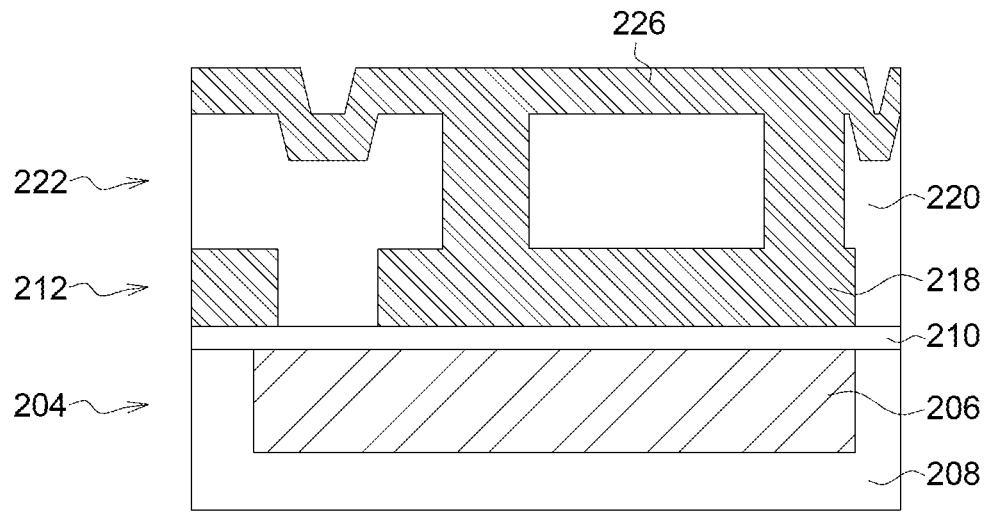
Figure 8:
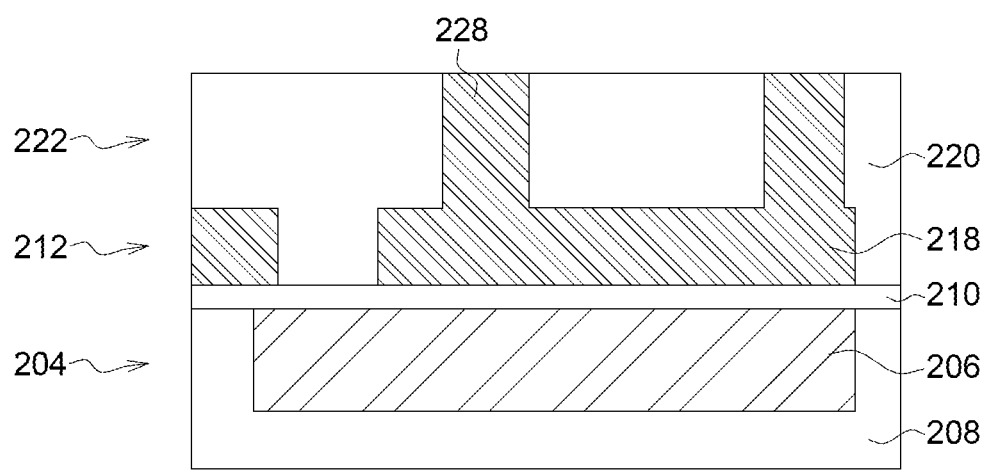

In the following step, a dielectric material 220 is formed on the layer 214 of the sacrificial place-holding material, particularly formed in the via level 212 and a second wire level 222 above the via level 212, as shown in FIG. 5. The dielectric material 220 fills into the first opening 216. The dielectric material 220 may be the same material for forming the dielectric 208, such as $SiO_2$. Then, a second opening 224 is formed through the dielectric material 220, as shown in FIGS. 6A-6B, wherein FIG. 6A shows a cross-sectional view, and FIG. 6B shows a top view. More specifically, the second opening 224 is formed at the position at which an intra-layer air gap is to be formed. As shown in FIG. 7, the sacrificial place-holding material 226 is filled into the second opening 224. In some embodiments, the sacrificial place-holding material 226 may not completely fill the second opening 224. In some embodiments, as shown in FIG. 8, a removing step, such as a chemical mechanical planarization (CMP) step, is carried out to remove the redundant sacrificial place-holding material 226. As such, a second sacrificial place-holding feature 228, which comprises the sacrificial place-holding material 226 in the second opening 224, is formed in the second wire level 222 above the via level 212. The second sacrificial place-holding feature 228 defines the positions of one or more intra-layer air gaps.

Figure 9:
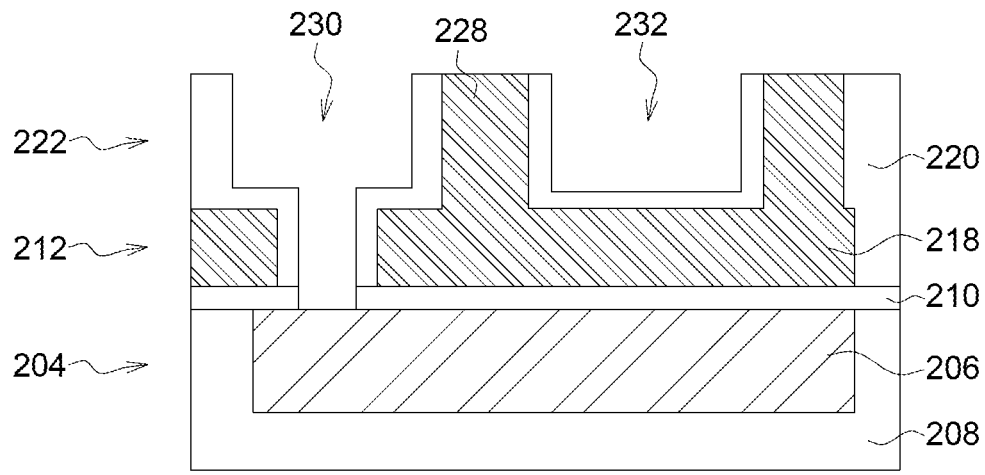
Figure 11A:
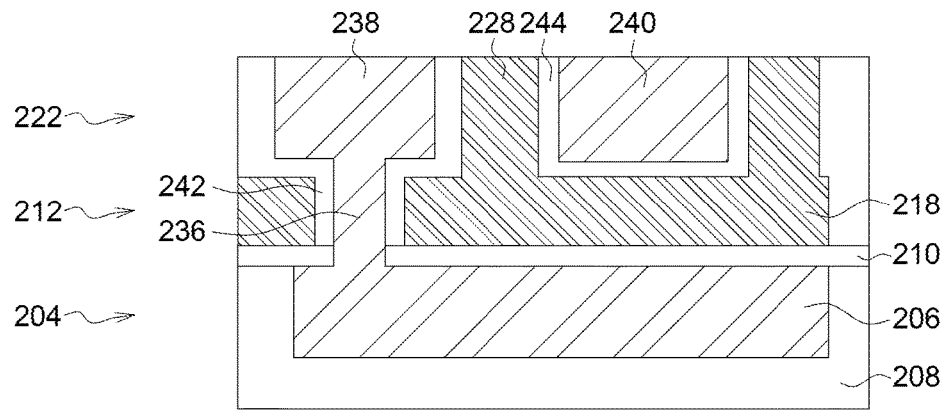
Figure 11B:
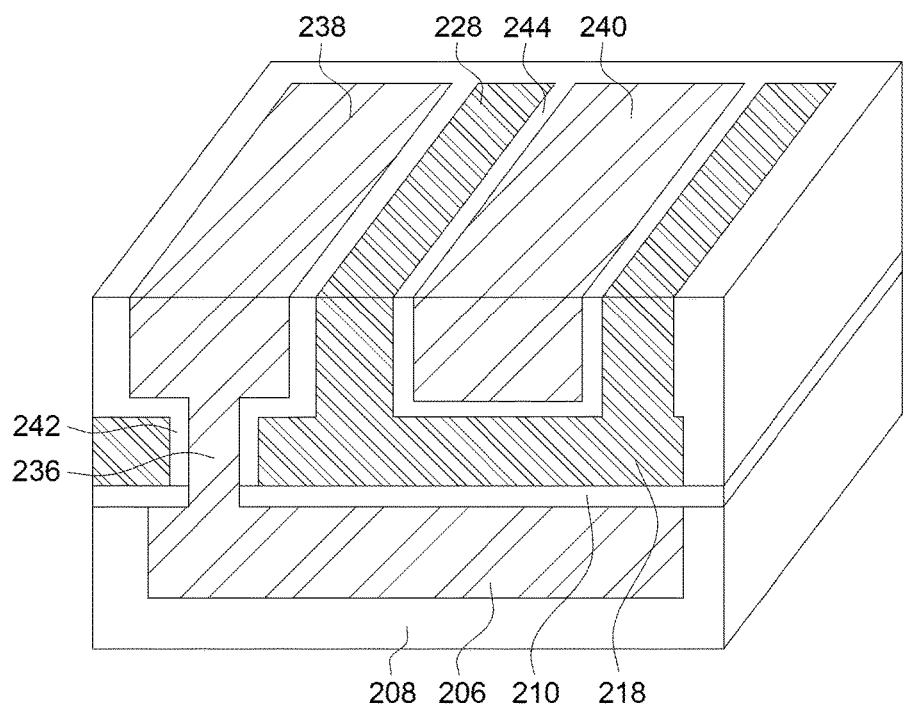

Then, as shown in FIG. 9, a third opening 230 and a fourth opening 232 are formed in the dielectric material 220, wherein the third opening 230 is configured for a second conductive feature 238 (shown in FIGS. 11A-11B) of the second wire level 222 and the via 236 (shown in FIGS. 11A-11B) of the via level 212, and the fourth opening 232 is configured for a third conductive feature 240 (shown in FIGS. 11A-11B) of the second wire level 222. A conductive material 234 is filled into the third opening 230 and the fourth opening 232, as shown in FIG. 10. The conductive material 234 may be Cu. In some embodiments, a removing step, such as a CMP step, is carried out to remove the redundant conductive material 234, as shown in FIGS. 11A-11B, wherein FIG. 11A shows a cross-sectional view, and FIG. 11B shows a three-dimensional view. As such, the via 236 of the via level 212 is formed, and the second conductive feature 238 and the third conductive feature 240 (such as traces) of the second wire level 222 are formed, wherein the via 236 connects the first conductive feature 206 and the second conductive feature 238. In some embodiments, as shown in FIGS. 11A-11B, a remained portion of the dielectric material 220 forms a dielectric 242 surrounding the via 236 and a dielectric 244 surrounding the second conductive feature 238 and the third conductive feature 240.

Figure 12A:
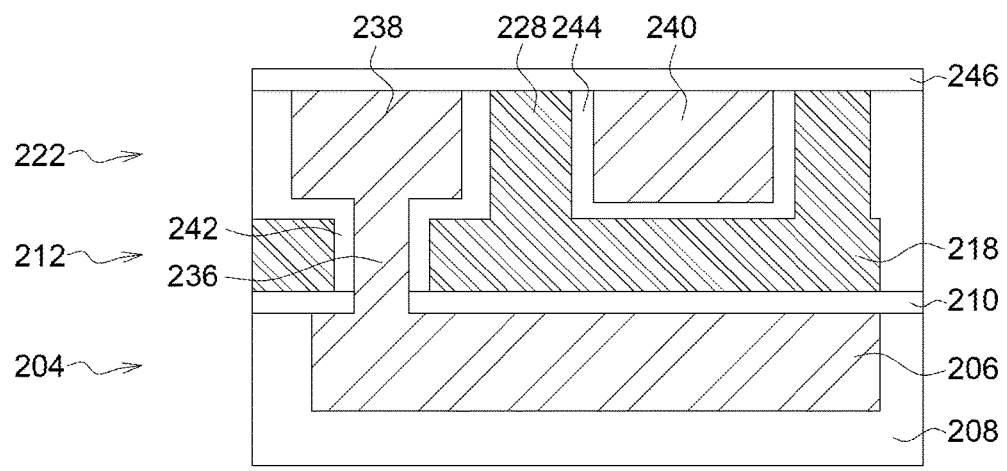
Figure 12B:
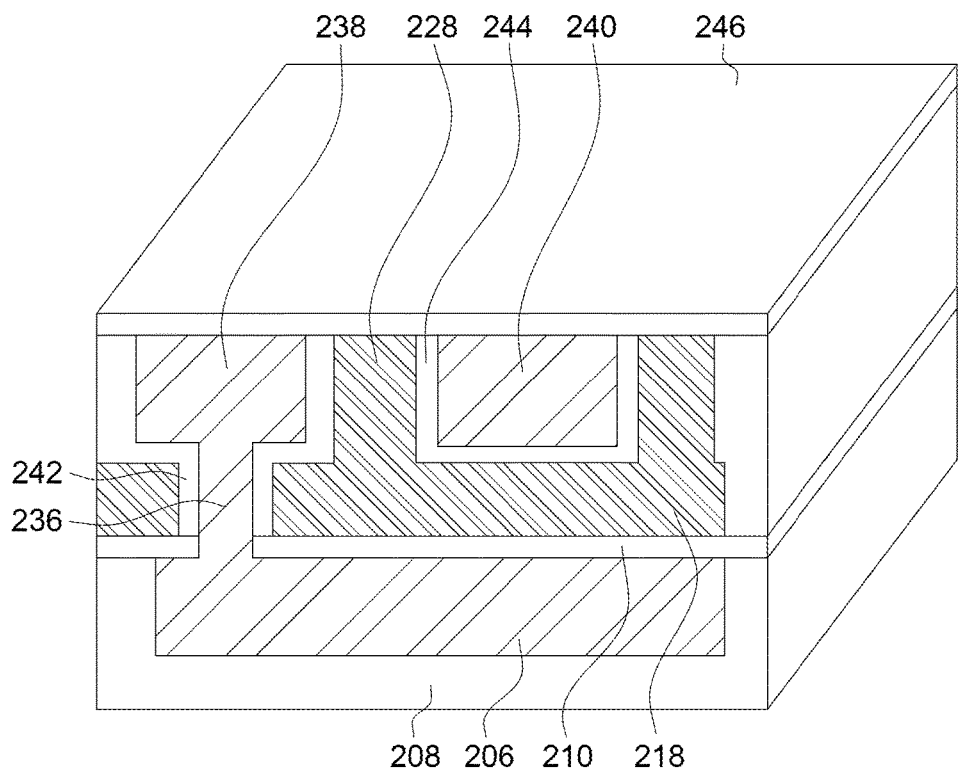
Figure 13A:
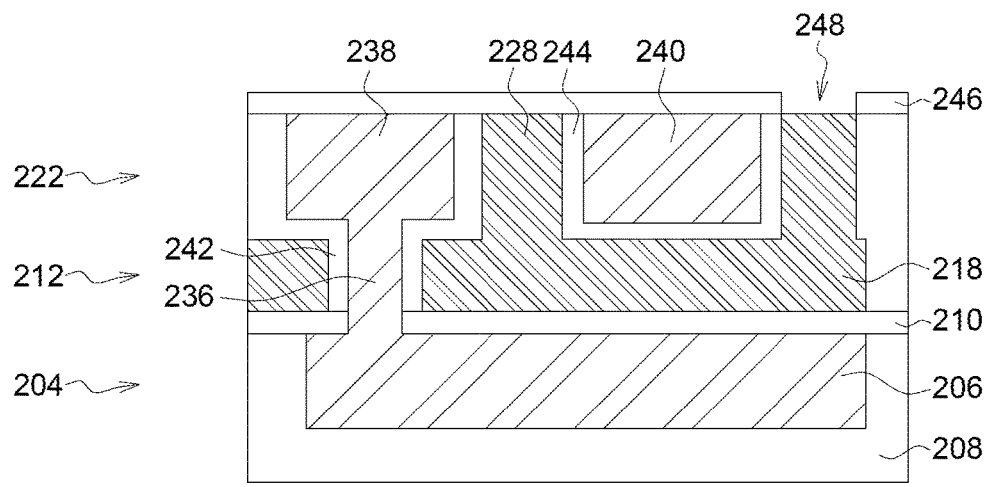
Figure 13B:
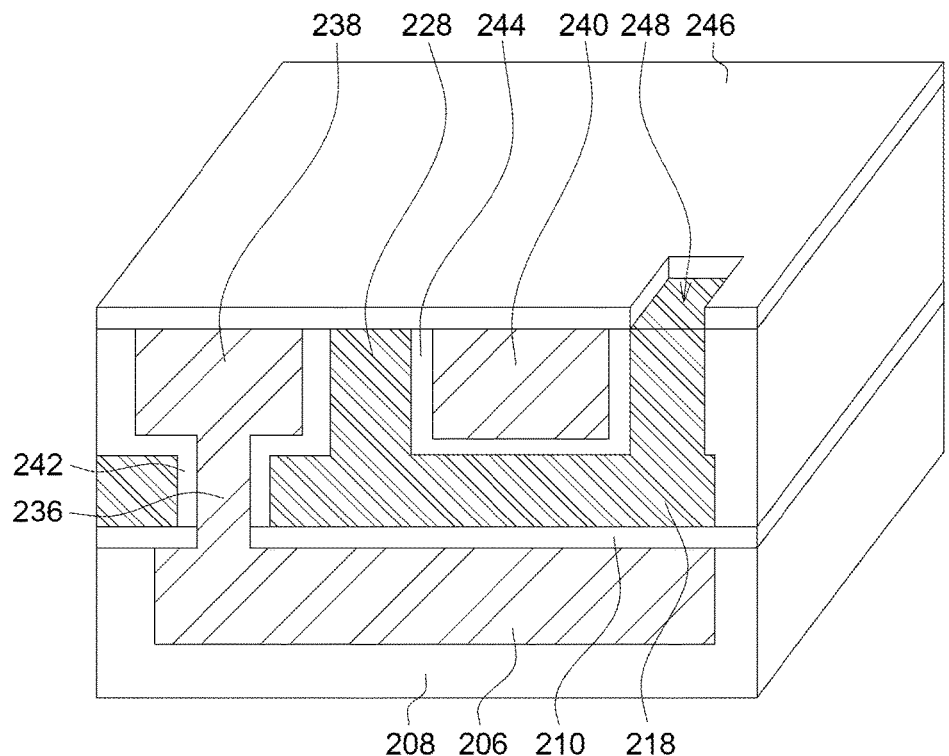
Figure 14A:
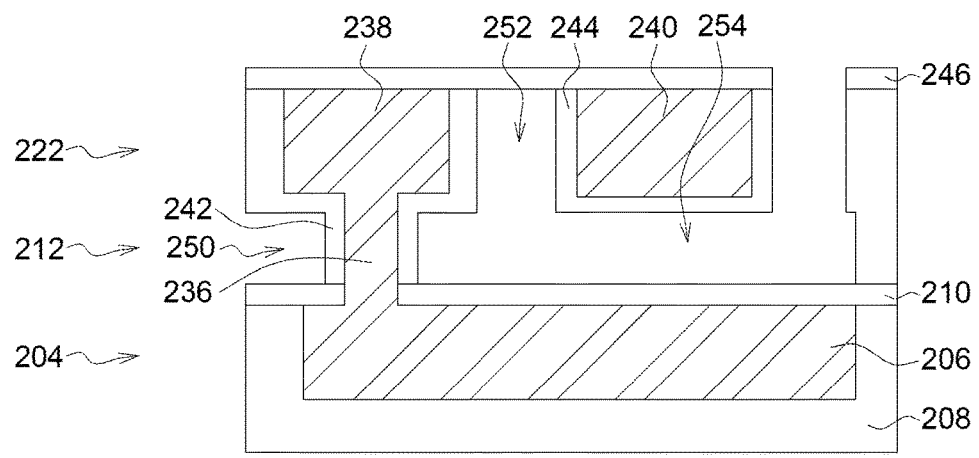
Figure 14B:
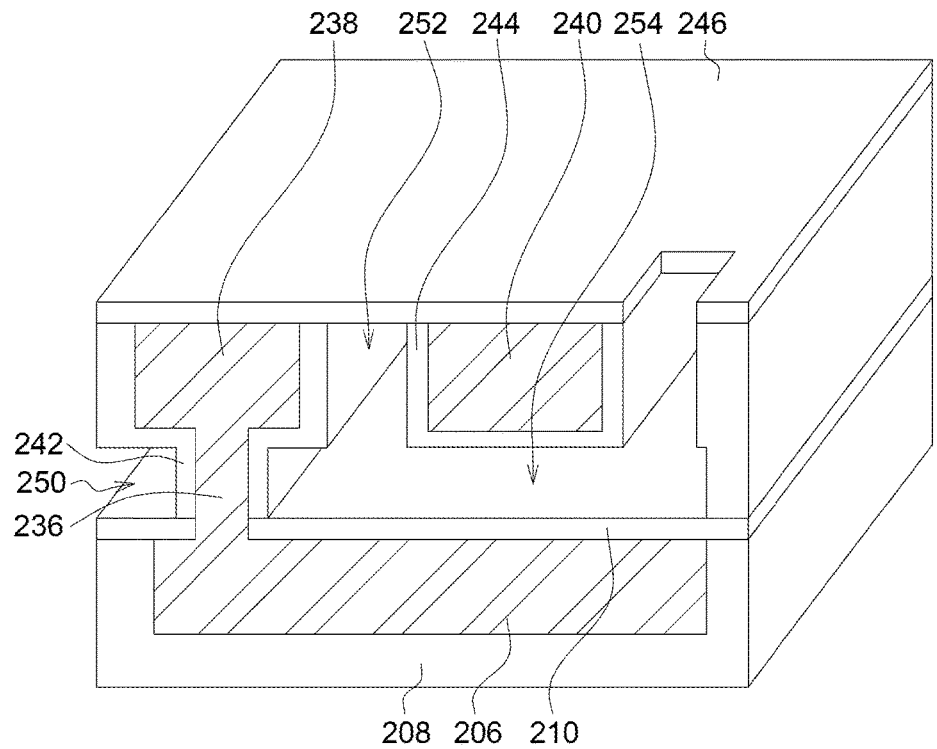

Then, as shown in FIGS. 12A-12B, a second barrier layer 246 may be formed on the second wire level 222. The second barrier layer 246 may be formed of the same material for forming the first barrier layer 210, such as SiCO, SiCN, SiN, or the like. As shown in FIGS. 13A-13B, a through hole 248 is formed through the second barrier layer 246 and exposes the sacrificial place-holding material. Thereby, the first sacrificial place-holding feature 218 and the second sacrificial place-holding feature 228 can be removed through the through hole 248 of the second barrier layer 246, so as to form one or more inter-layer air gaps and one or more intra-layer air gaps. In particular, as shown in FIGS. 14A-14B, a first air gap 250 (an inter-layer air gap) and a second air gap 252 (an intra-layer air gap) are formed, wherein the first air gap 250 is between the first conductive feature 206 and the second conductive feature 238, the second air gap 252 is between the second conductive feature 238 and the third conductive feature 240, and the first air gap 250 and the second air gap 252 are linked. In some embodiments, the step of removing the first sacrificial place-holding feature 218 and the second sacrificial place-holding feature 228 further forms a third air gap 254 (an inter-layer air gap) between the first conductive feature 206 and the third conductive feature 240, wherein the third air gap 254 and the first and second air gaps 250 and 252 are linked. According to some embodiments, the removal step may be carried out using an etchant. The etchant may be selected from the group consisting of: SPM ($H_2SO_4$—$H_2O_2$), HPM (HCl—$H_2O_2$—$H_2O$), and APM ($NH_4OH$—$H_2O_2$—$H_2O$).

Conventionally, air gaps may be formed by incompletely filling a material into holes or trenches and then the air gaps are remained in the semiconductor structure. While in this method, the air gaps are formed by firstly forming a sacrificial place-holding material and then removing it. As such, the shapes and sizes of the air gaps can be controlled more easily.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a first wire level comprising a first conductive feature;
a second wire level disposed on the first wire level, the second wire level comprising a second conductive feature and a third conductive feature; and
a via level disposed between the first wire level and the second wire level, the via level comprising a via connecting the first conductive feature and the second conductive feature;
wherein there is a first air gap between the first conductive feature and the second conductive feature, there is a second air gap between the second conductive feature and the third conductive feature, the first air gap comprises a portion in the via level and between the first conductive feature and the second conductive feature, and the first air gap and the second air gap are linked.

2. The semiconductor structure according to claim 1, wherein the first air gap surrounds the via.

3. The semiconductor structure according to claim 1, wherein there is a third air gap between the first conductive feature and the third conductive feature, and the third air gap and the first and second air gaps are linked.

4. The semiconductor structure according to claim 1, further comprising:
a first barrier layer disposed on the first wire level, wherein the via is through the first barrier layer; and
a second barrier layer disposed on the second wire level.

5. The semiconductor structure according to claim 1, wherein the first wire level further comprises a dielectric surrounding the first conductive feature, the second wire level further comprises a dielectric surrounding the second conductive feature and the third conductive feature, and the via level further comprises a dielectric surrounding the via.

6. A method for manufacturing a semiconductor structure, comprising:
providing a preliminary structure, the preliminary structure comprising a first wire level, the first wire level comprising a first conductive feature;
forming a first sacrificial place-holding feature in a via level above the first wire level;
forming a second sacrificial place-holding feature in a second wire level above the via level;
forming a via of the via level and forming a second conductive feature and a third conductive feature of the second wire level, wherein the via connects the first conductive feature and the second conductive feature; and
removing the first sacrificial place-holding feature and the second sacrificial place-holding feature to form a first air gap and a second air gap, wherein the first air gap is between the first conductive feature and the second conductive feature, the second air gap is between the second conductive feature and the third conductive feature, the first air gap comprises a portion in the via level and between the first conductive feature and the second conductive feature, and the first air gap and the second air gap are linked.

7. The method according to claim 6,
wherein forming the first sacrificial place-holding feature comprises:
forming a layer of a sacrificial place-holding material on the preliminary structure, the layer of the sacrificial place-holding material having a first opening configured for the via; and
wherein forming the second sacrificial place-holding feature comprises:
forming a dielectric material on the layer of the sacrificial place-holding material, the dielectric material filling into the first opening;
forming a second opening through the dielectric material; and
filling the sacrificial place-holding material into the second opening.

8. The method according to claim 7, wherein the sacrificial place-holding material comprises a metal element.

9. The method according to claim 7, wherein the sacrificial place-holding material comprises at least one selected from the group consisting of: TiN, Ti, Ni, Co, TaN, Ta, Al, TiAl, and TaAl.

10. The method according to claim 7, wherein forming the second conductive feature, the third conductive feature and the via comprises:
forming a third opening and a fourth opening in the dielectric material, wherein the third opening is configured for the second conductive feature and the via, and the fourth opening is configured for the third conductive feature; and
filling a conductive material into the third opening and the fourth opening.

11. The method according to claim 7, wherein the preliminary structure further comprises a dielectric surrounding the first conductive feature, and a remained portion of the dielectric material forms a dielectric surrounding the via and a dielectric surrounding the second conductive feature and the third conductive feature.

12. The method according to claim 6, wherein removing the first sacrificial place-holding feature and the second sacrificial place-holding feature uses an etchant.

13. The method according to claim 12, wherein the etchant is selected from the group consisting of: SPM ($H_2SO_4$—$H_2O_2$), HPM (HCl—$H_2O_2$—$H_2O$), and APM ($NH_4OH$—$H_2O_2$—$H_2O$).

14. The method according to claim 6, wherein removing the first sacrificial place-holding feature and the second sacrificial place-holding feature further forms a third air gap between the first conductive feature and the third conductive feature, and the third air gap and the first and second air gaps are linked.

15. The method according to claim 6, wherein the preliminary structure further comprises a first barrier layer disposed on the first wire level, and the method further comprises:
   forming a second barrier layer on the second wire level, wherein the first sacrificial place-holding feature and the second sacrificial place-holding feature are removed through a through hole of the second barrier layer.

\* \* \* \* \*